United States Patent
Huang et al.

(10) Patent No.: US 8,054,134 B2
(45) Date of Patent: Nov. 8, 2011

(54) COUPLING ISOLATION METHOD AND OPERATIONAL AMPLIFIER USING THE SAME

(75) Inventors: Ju-Lin Huang, Hsinchu County (TW); Chia-Wei Su, Hsinchu (TW); Po-Yu Tseng, Taoyuan County (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 12/759,714

(22) Filed: Apr. 14, 2010

(65) Prior Publication Data

US 2011/0187456 A1     Aug. 4, 2011

(30) Foreign Application Priority Data

Feb. 1, 2010   (TW) ................................ 99102789 A

(51) Int. Cl.
*H03F 1/14*      (2006.01)

(52) U.S. Cl. ........................ 330/292; 330/302; 330/255

(58) Field of Classification Search .................. 330/292, 330/302, 255
See application file for complete search history.

(56) References Cited

U.S. PATENT DOCUMENTS

| | | | |
|---|---|---|---|
| 6,522,199 B2 * | 2/2003 | Sidiropoulos et al. | 330/253 |
| 6,621,334 B2 * | 9/2003 | Ausserlechner et al. | 330/9 |
| 7,408,390 B2 * | 8/2008 | Yamada | 327/124 |
| 7,652,538 B2 * | 1/2010 | Choi | 330/292 |
| 7,786,801 B2 * | 8/2010 | Kim | 330/255 |
| 7,907,011 B2 * | 3/2011 | Chung | 330/255 |

* cited by examiner

*Primary Examiner* — Patricia Nguyen
(74) *Attorney, Agent, or Firm* — Winston Hsu; Scott Margo

(57) ABSTRACT

A coupling isolation method for preventing a load signal from coupling into an operational amplifier is disclosed. The coupling isolation method includes generating a system signal before the operational amplifier outputs a computation result, switching off a Miller compensation signal path of the operational amplifier at a first time point according to the system signal, and electrically connecting an output end of the operational amplifier and a load at a second time point according to the system signal to output the computation result.

7 Claims, 7 Drawing Sheets

COUPLING ISOLATION METHOD AND OPERATIONAL AMPLIFIER USING THE SAME

BACKGROUND OF THE INVENTION

1. Field of the Invention

The present invention is related to a coupling isolation method and operational amplifier using the same, and more particularly, to a coupling isolation method and operational amplifier using the same which prevent a load signal from coupling into the operational amplifier through switching off a Miller compensation signal path.

2. Description of the Prior Art

With advances in semiconductor manufacturing technology, an accurate operational amplifier is essential for most electronic applications. As implied by the name, the operational amplifier is utilized for amplifying signals and functioning as a voltage buffer and driver. Other than the original use, the operational amplifier can implement various functions if connected in different configurations. For example, when connected in a negative feedback configuration, the operational amplifier can amplify a differential input signal to a specific multiple to perform common calculations, such as addition, multiplication, etc. Inversely, when connected in positive feedback, the operational amplifier can be utilized for generating an oscillating signal. Thus, the operational amplifier is widely employed in major electronic applications, such as a sample and hold (S/H) circuit, a liquid crystal display (LCD), etc.

Please refer to FIG. 1, which is a schematic diagram of an operational amplifier 10 of the prior art. The operational amplifier 10 includes a differential input stage 100, a gain stage 102, an output stage 104 and a Miller compensation module 106. The differential input stage 100 is utilized for receiving a differential input signal VIN. The gain stage 102 is utilized for amplifying the differential input signal VIN. Finally, the output stage 104 further amplifies the differential input signal VIN and enhances output resistance of the operational amplifier 10. In addition, the Miller compensation module 106 compensates frequency response of the operational amplifier 10 by adding a dominant pole on a signal path of the operational amplifier 10, so as to minimize influence of other poles on stability of a computation result RST. In general, in order to preserve the correct computation result RST, the operational amplifier 10 further includes an output switch 108 coupled between the output stage 104 and a load RL. To minimize influence of external noise on the operational amplifier 10, the output switch 108 is closed (switched on) only when an external circuit has to access (read) the computation result RST.

However, once the output switch 108 is closed, charges stored in two ends of the output switch 108 are redistributed, resulting in undesired spikes or notches in the computation result RST. Even worse, the singularities of the computation result RST couple into the operational amplifier 10 via the Miller compensation module 106, which decays performance of the operational amplifier 10. In detail, please refer to FIG. 2, which is a time-variant schematic diagram of signals of the operational amplifier 10. In FIG. 2, when the input signal VIN varies from a low potential to a high potential at a time point t1, inner signals of the operational amplifier 10 follow the variation through a closed-loop process inside the operational amplifier 10 and settle to fixed voltage levels. When the output switch 108 is switched on at the time point t1, charges stored in two ends of the output switch 108 redistribute, resulting in a notch in the computation result RST. In such a situation, notches are further induced in voltages VN1, VN2 of nodes N1, N2 of the operational amplifier 10, which increases a charging current of a transistor M1 and decreases a discharging current of a transistor M2 in the output stage 104, enabling rapid restoration of the computation result RST to the high potential. However, the restoration of the computation result RST leads to a second coupling, which accelerates the recovery of the voltages VN1, VN2 as well. As a result, a leakage current is generated in the operational amplifier 10 due to the simultaneous conduction of the transistors M1, M2, which delays a charging procedure of a load signal S_LD of the load RL, as illustrated in FIG. 2. In FIG. 2, the practical load signal S_LD increases slower than ideal waveforms.

Therefore, avoiding singular waveforms of the load signal induced by the second coupling has been a major focus of the industry.

SUMMARY OF THE INVENTION

It is therefore a primary objective of the claimed invention to provide a coupling isolation method and operational amplifier using the same.

The present invention discloses a coupling isolation method for preventing a load signal from coupling into an operational amplifier. The coupling isolation method comprises generating a system signal before the operational amplifier outputs a computation result, switching off a Miller compensation signal path at a first time point according to the system signal, and electrically connecting an output end of the operational amplifier and a load at a second time point according to the system signal to output the computation result.

The present invention further discloses an operational amplifier capable of preventing a load signal from coupling into the operational amplifier. The operational amplifier comprises a reception end for receiving a system signal, an output end for outputting a computation result, a delay unit for generating an interruption signal and an output indication signal according to the system signal, a differential input stage for receiving a differential input signal, a gain stage for amplifying the differential input signal, an output stage for generating the computation result according to the amplified differential input signal, an output switch coupled between the output end and a load for determining whether the output end is electrically connected to the load according to the output indication signal, a Miller compensation module comprising a back end coupled between the output end and the output stage and a front end for compensating frequency response of the operational amplifier, and a switch module comprising one end coupled to the front end of the Miller compensation module and another end coupled between the gain stage and the output stage for determining whether the front end of the Miller compensation module is electrically connected to the gain stage and the output stage according to the interruption signal.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
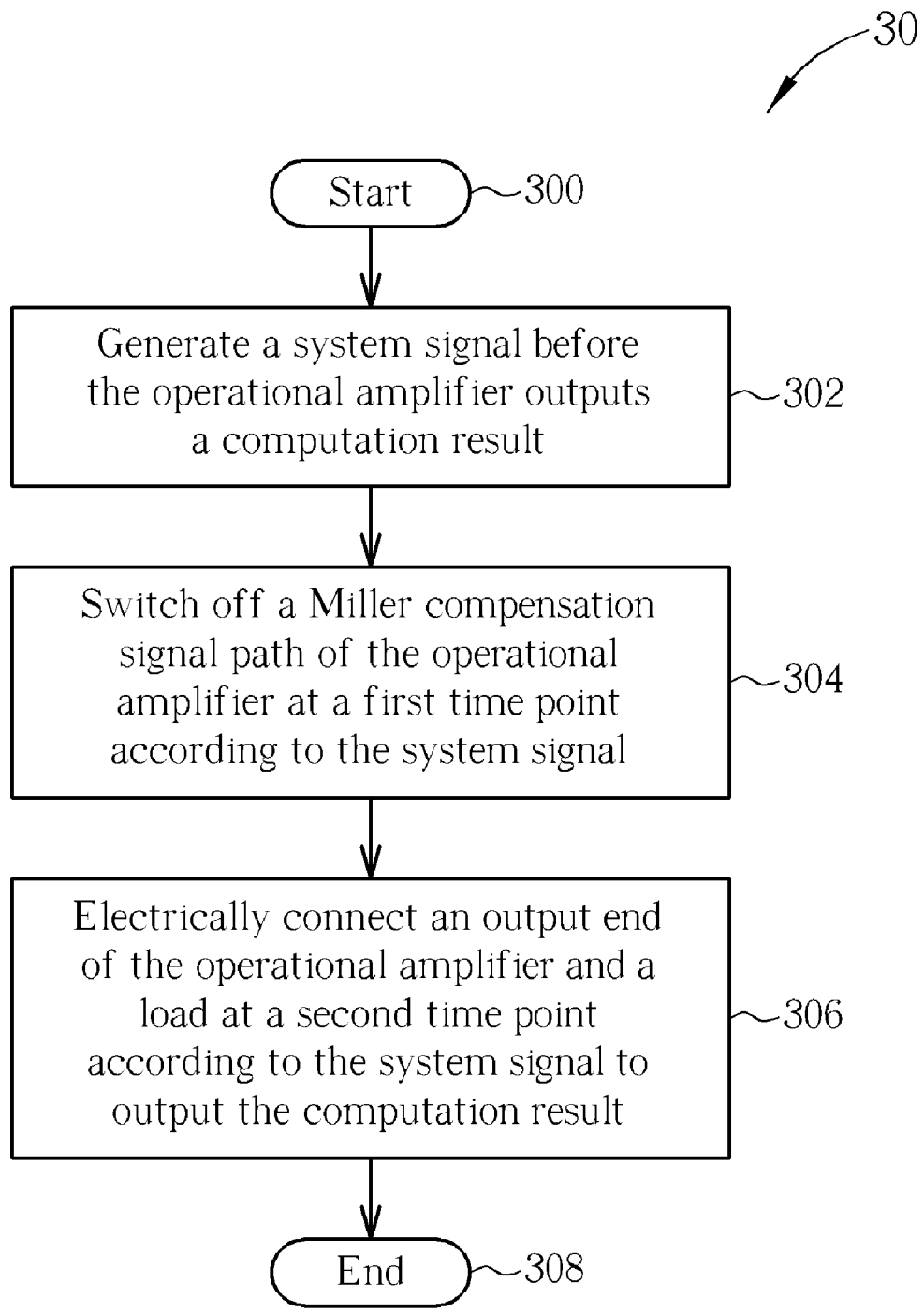
FIG. 3 is a schematic diagram of a coupling isolation process according to an embodiment of the present invention.

Please refer to FIG. 3, which is a schematic diagram of a coupling isolation process 30 according to an embodiment of the present invention. The coupling isolation process 30 is utilized for preventing a load signal from coupling into an operational amplifier, and includes the follow steps:

Step 300: Start.

Step 302: Generate a system signal before the operational amplifier outputs a computation result.

Step 304: Switch off a Miller compensation signal path of the operational amplifier at a first time point according to the system signal.

Step 306: Electrically connect an output end of the operational amplifier and a load at a second time point according to the system signal to output the computation result.

Step 308: End.

Figure 1:
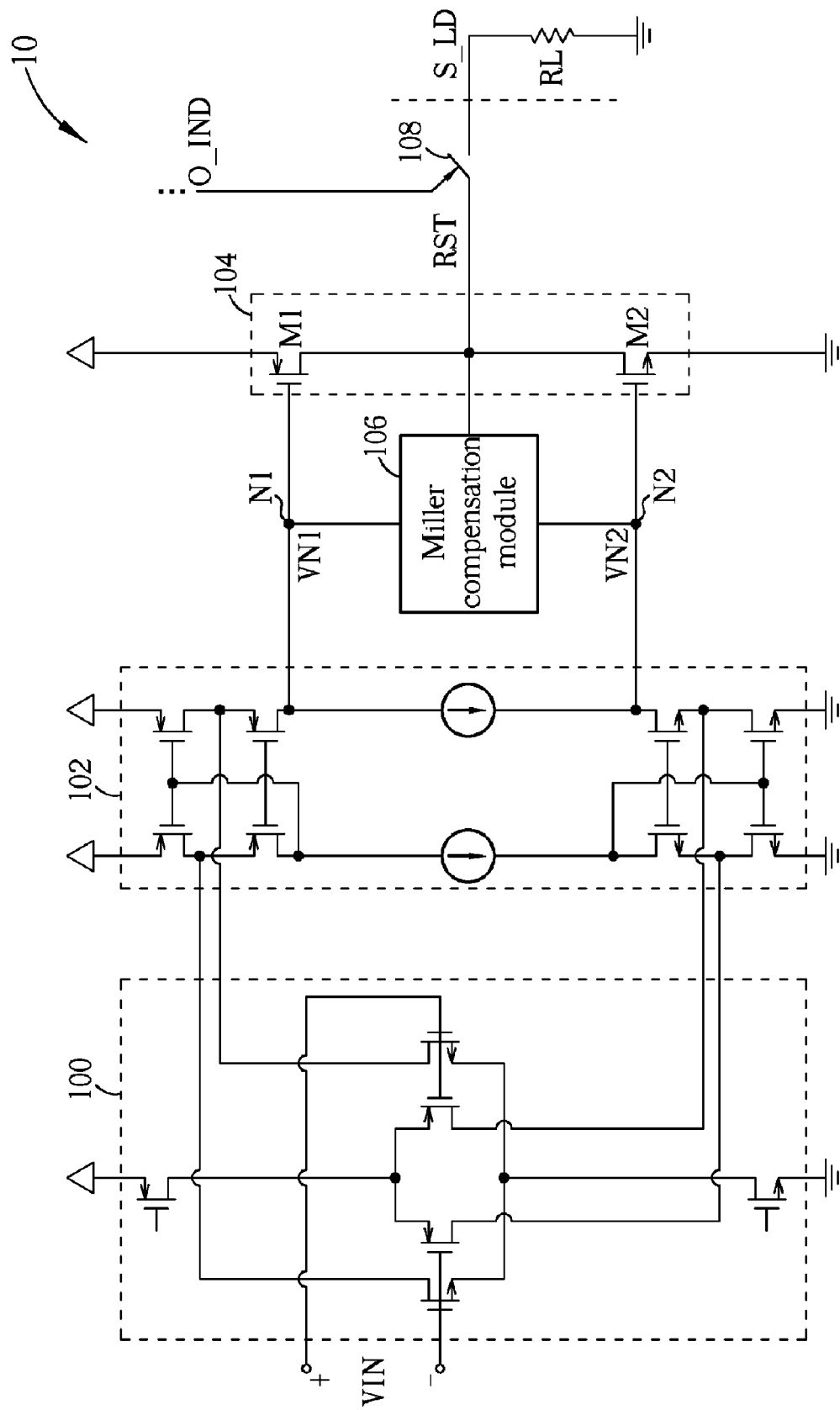
FIG. 1 is a schematic diagram of an operational amplifier of the prior art.
Figure 2:
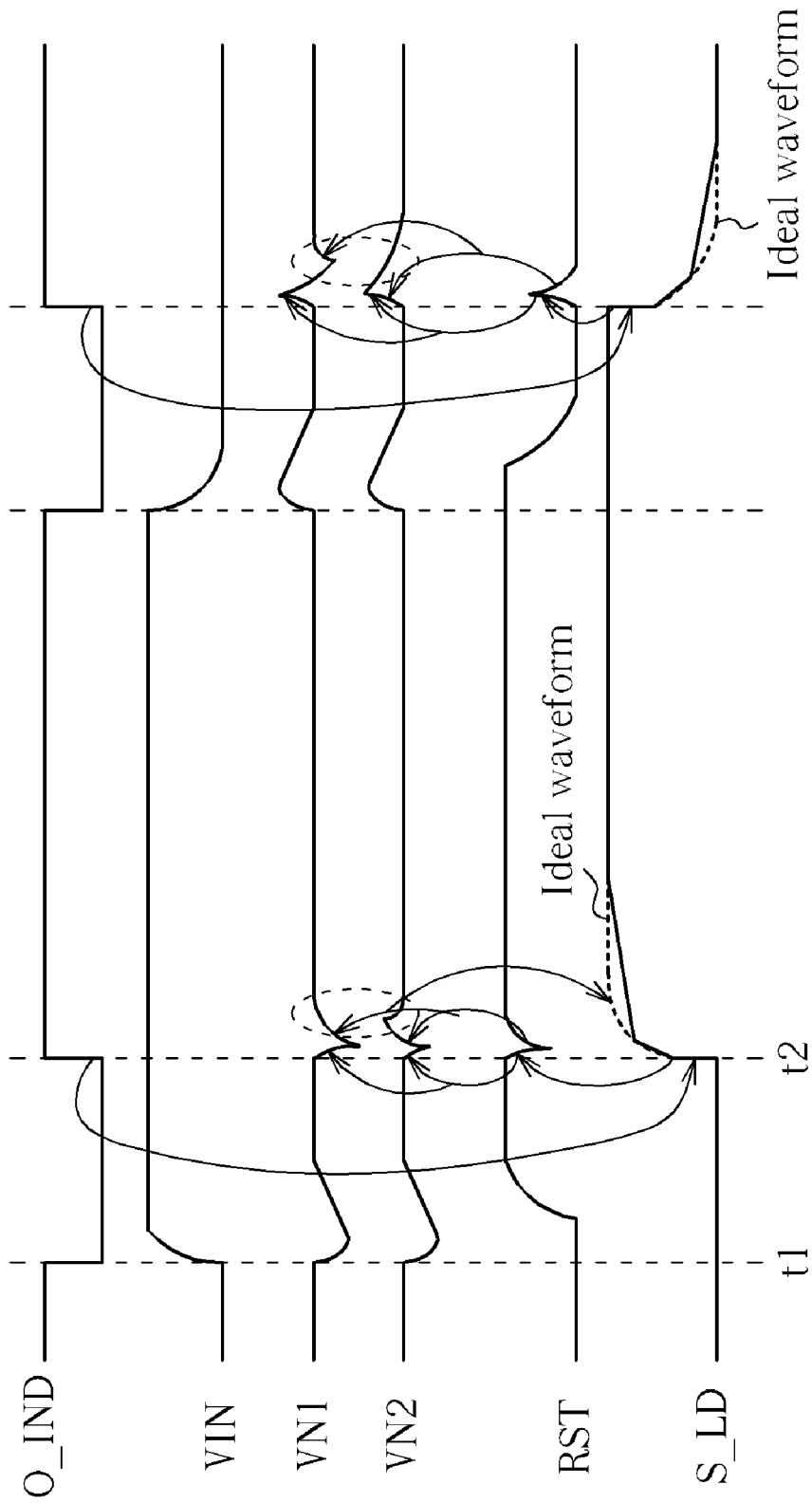
FIG. 2 is a time-variant schematic diagram of signals of the operational amplifier shown in FIG. 1.

In short, based on the coupling isolation process 30, the Miller compensation signal path is switched off before the operational amplifier outputs the computation result. As a result, even though charges stored in two ends of an output switch of the operational amplifier redistribute when the output switch is switched on for outputting the computation result, singularities like spikes or notches induced by the redistribution are limited to the computation result, and no longer lead to a second coupling which slows down a charging rate and a discharging rate of the load signal S_LD in the prior art, as illustrated in FIG. 2.

To ensure the Miller compensation signal path is cut off before the output switch is switched on, the second time point has to be later than or at the same time as the first time point to prevent the load signal from coupling into the operational amplifier via the Miller compensation signal path. Note that, the Miller compensation signal path is between the output end of the operational amplifier and an input end of an output stage, and is utilized for compensating frequency response of the operational amplifier to enhance stability of the operational amplifier.

More specifically, the Miller compensation signal path can be cut off by switching off a switch coupled between the input end and the output end at the first time point. Correspondingly, the output end of the operational amplifier can be electrically connected to the load by switching on a switch coupled between the output end and the load.

Figure 4:
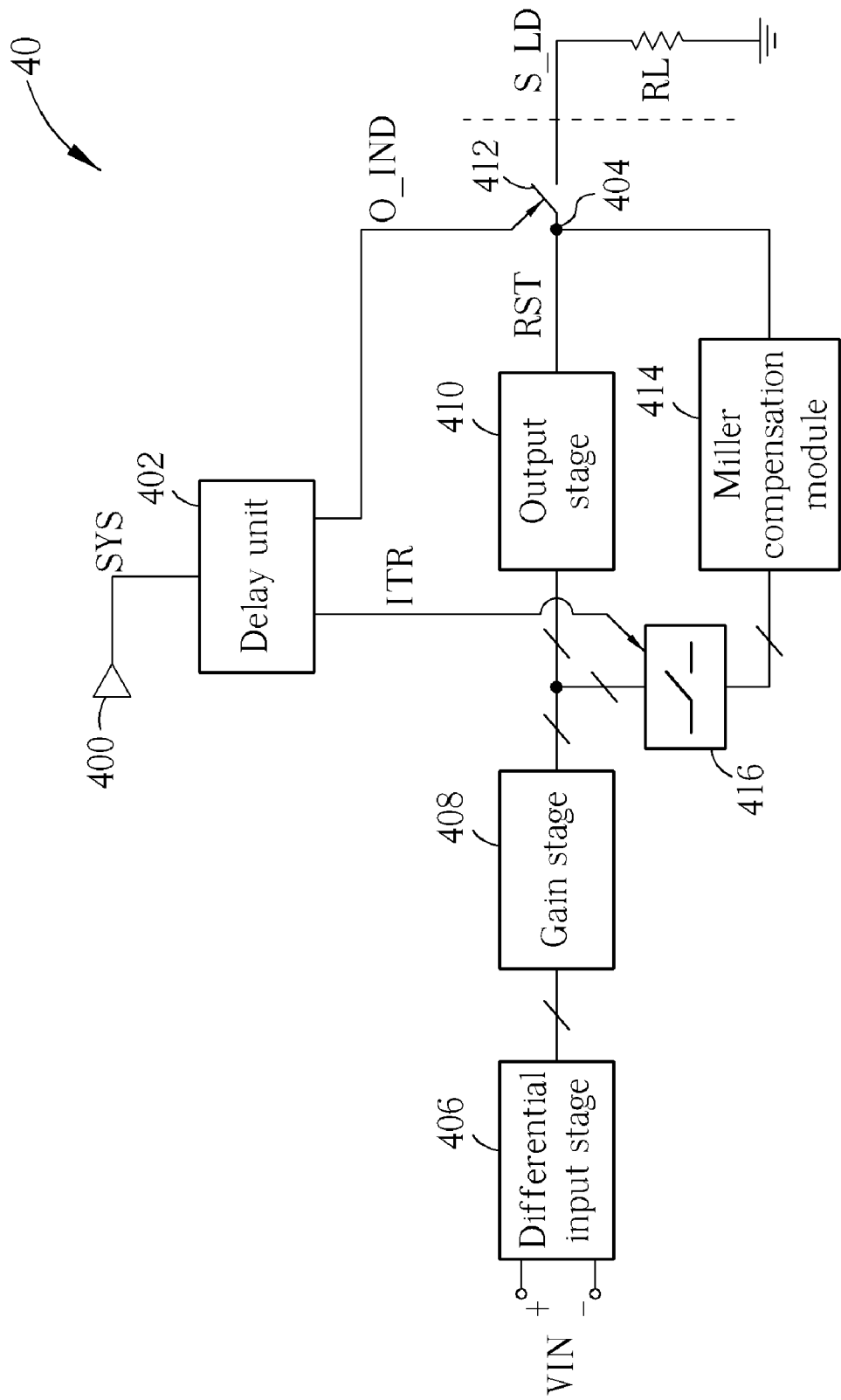
FIG. 4 is a schematic diagram of an operational amplifier according to an embodiment of the present invention.

To implement the coupling isolation process 30, please refer to FIG. 4, which is a schematic diagram of an operational amplifier 40 according to an embodiment of the present invention. The operational amplifier 40 includes a reception end 400, a delay unit 402, an output end 404, a differential input stage 406, a gain stage 408, an output stage 410, an output switch 412, a Miller compensation module 414 and a switch module 416. The reception end 400 is utilized for receiving a system signal SYS. The output end 404 is utilized for outputting a computation result RST. The delay unit 402 is utilized for generating an interruption signal ITR and an output indication signal O_IND according to the system signal SYS. The differential input stage 406 is utilized for receiving a differential input signal VIN. The gain stage 408 is utilized for amplifying the differential input signal VIN. The output stage 410 is utilized for generating the computation result RST according to the amplified differential input signal VIN. The output switch 412 is utilized for determining whether the output end 404 is electrically connected to a load RL according to the output indication signal O_IND. The Miller compensation module 414 is utilized for compensating frequency response of the operational amplifier 40. The switch module 416 is utilized for determining whether the Miller compensation module 414 is electrically connected to the gain stage 408 and the output stage 410 according to the interruption signal ITR.

In short, the switch module 416 is particularly installed between the input end of the output stage 410 and the Miller compensation module 414, to cut off the Miller compensation signal path of the operational amplifier 40 before the output switch 412 is switched on according to the interruption signal ITR generated by the delay unit 402. As a result, redistribution of charges stored in two ends of the output switch 412 no longer cause singularities in a load signal S_LD of the load RL.

Figure 5A:
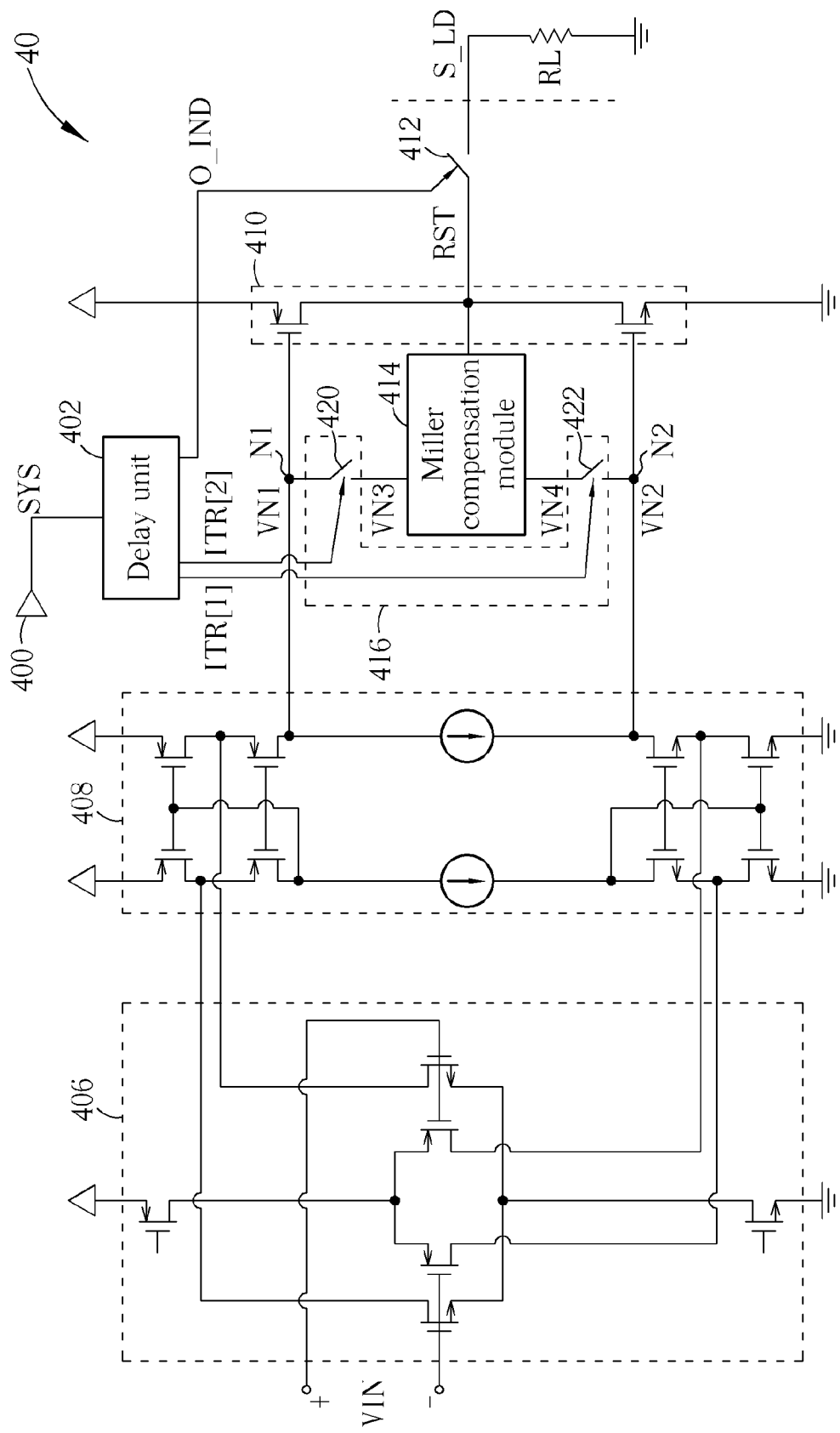
FIG. 5A is a schematic diagram of a detailed embodiment of the operation amplifier shown in FIG. 4.
Figure 5B:
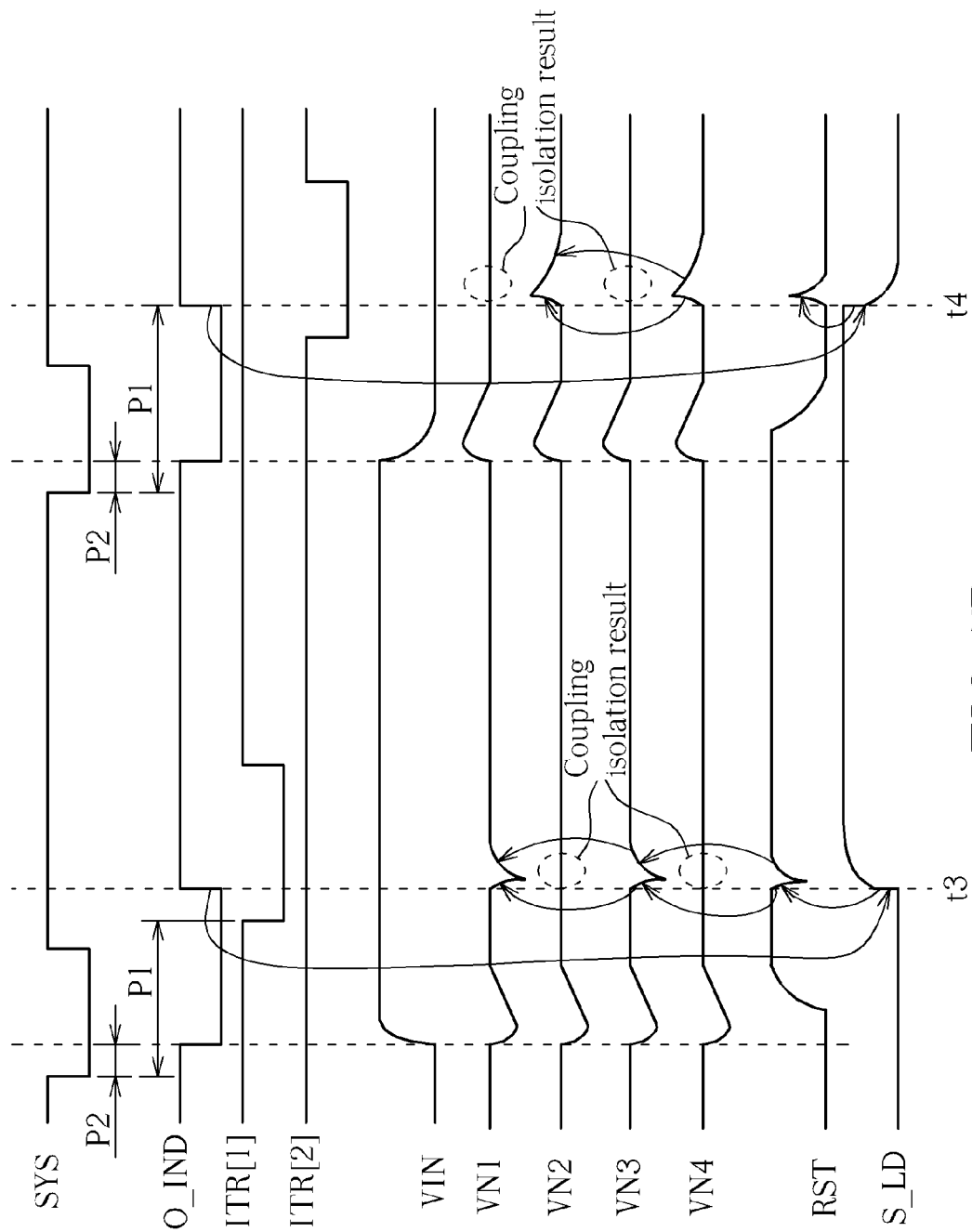
FIG. 5B is a time-variant schematic diagram of inner signals of the operational amplifier shown in FIG. 5A.

In detail, please refer to FIG. 5A, which is a schematic diagram of a detailed embodiment of the operational amplifier 40. In FIG. 5A, detailed components of the operational amplifier 40 are similar to the operational amplifier 10 except for the additional delay unit 402 and the switch module 416 utilized for implementing the coupling isolation process 30. The switch module 416 includes switches 420, 422. Please continue to refer to FIG. 5B, which is a time-variant schematic diagram of internal signals of the operational amplifier 40. In FIG. 5B, the reception end 400 receives the system signal SYS comprising a square wave with a low voltage potential from an external control circuit before the operational amplifier 40 outputs the correct computation result RST. The delay unit 402 delays the system signal SYS for a first default period P1 to generate a sub signal ITR[1] of the interruption signal ITR, and delays the system signal SYS for a second default period P2 to generate the output indication signal O_IND. Note that, the Miller compensation module 414 is disabled until the output switch 412 is switched on. For that reason, the first default period P1 has to be longer than the second default period P2 to prevent the load signal S_LD from coupling into the operational amplifier 40 via the Miller compensation module 414. That is, the switch 422 stays off until the output switch 412 is switched on at a time point T3 to prevent singularities from appearing in a waveform of a voltage VN2 of a node N2 for the sake of charge redistribution. In FIG. 5A, other than a lower-bridge Miller compensation signal path controlled by the switch 422, the load signal S_LD may further couple into the operational amplifier 40 via an upper-bridge Miller compensation signal path. Therefore, the system signal SYS has to be synchronized with a charging/discharging sequence of the output stage 410 to timely cut off the upper-bridge Miller compensation signal path by the switch 420. For example, in FIG. 5B, the delay unit 402 respectively delays the system signal SYS for the first default period P1 and the second default period P2 before the output switch 412 is switched on at a time point T4, to switch off the switch 420 according to a sub signal ITR[2] of the interruption signal ITR before the time point T4. In comparison with FIG. 2, partial notches are removed from node voltages VN1, VN2, VN3, VN4 (coupling isolation result), and no longer delays a charging procedure of the load signal S_LD.

To maintain stability of the operational amplifier 40, in FIG. 5B, the interruption signal ITR merely indicates to cut off the upper-bridge Miller compensation signal path or the lower-bridge Miller compensation signal path before the output switch 412 is switched on. That is, design of the interruption signal ITR highly depends on practical circuit conditions. For example, if the switch module 416 includes only the switch 422 or the switch 420, correspondingly, the delay unit 402 only has to generate the sub signal ITR[1] or the sub signal ITR[2] of the interruption signal ITR.

Figure 6:
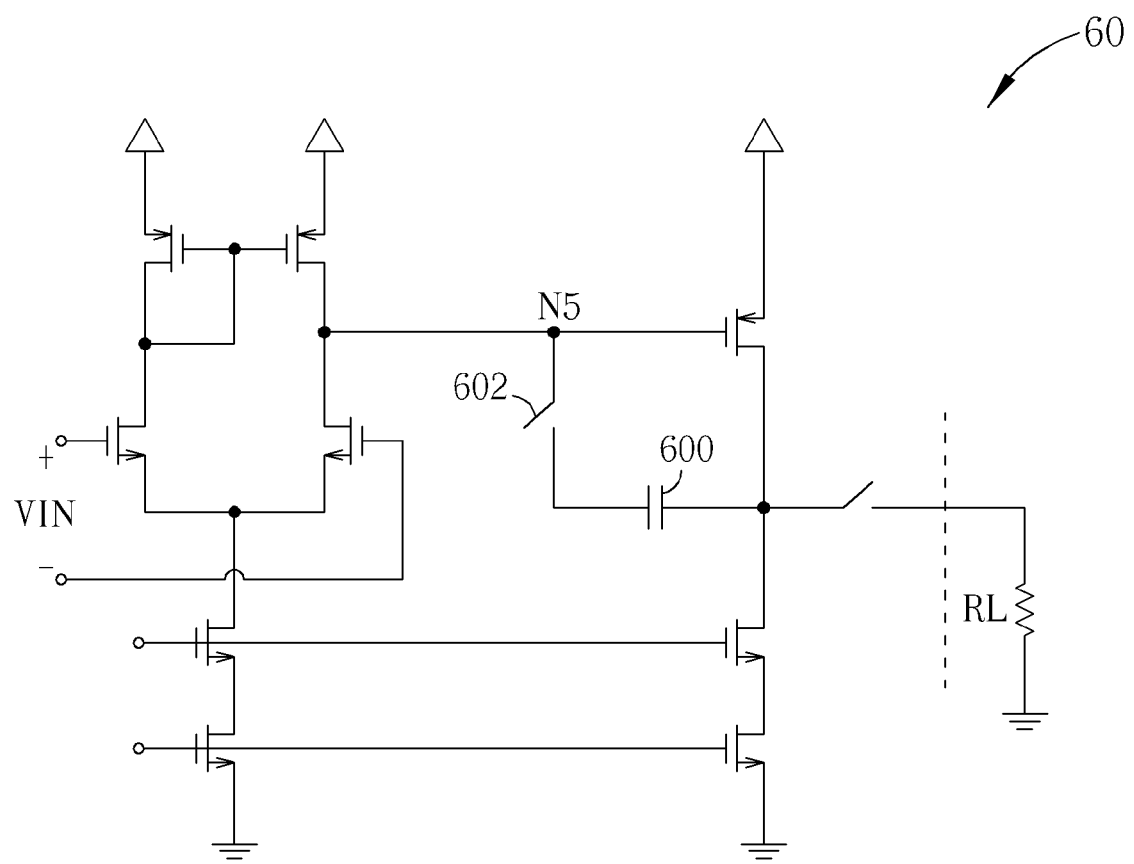
FIG. 6 is a schematic diagram of an alternative detailed embodiment of the operation amplifier shown in FIG. 4.

Other than the detailed embodiment shown in FIG. 5A, please refer to FIG. 6, which is a schematic diagram of an alternative detailed embodiment (namely an operational amplifier 60) of the operational amplifier 40 shown in FIG. 4. The operational amplifier 60 is a two-stage operational amplifier. According to the architecture of the operational amplifier 40 shown in FIG. 4, the Miller compensation module 414 of the operational amplifier 60 is a capacitor 600. In such a situation, in order to implement the coupling isolation process 30, a switch 602 is installed between the capacitor 600 and a node N5 to timely cut off a Miller compensation signal path of the operational amplifier 60.

Detailed operations of the operational amplifiers 40, 60, such as operations of the transistors, are well known to those skilled in the art and are not the focus of the present invention, and therefore are not further narrated herein.

In the prior art, whenever the switch 108 is switched on, the load signal S_LD is coupled into the operational amplifier 10 via the Miller compensation module 106, resulting in singular waveforms in the load signal S_LD and probable errors in future operations. In comparison, according to the present invention, the switches 420, 422, 602 are respectively installed in the Miller compensation signal paths of the operational amplifiers 40, 60 to prevent the load signal S_LD from coupling into the operational amplifiers 40, 60, so as to enhance performance and stability of the operational amplifiers 40, 60.

To sum up, the load signal may be prevented from coupling into the operational amplifier through timely cutting off of the Miller compensation signal path, so as to enhance performance and stability of the operational amplifier.

Those skilled in the art will readily observe that numerous modifications and alterations of the device and method may be made while retaining the teachings of the invention.

What is claimed is:

1. A coupling isolation method for preventing a load signal from coupling into an operational amplifier, the coupling isolation method comprising:
   generating a system signal before the operational amplifier outputs a computation result;
   switching off a Miller compensation signal path of the operational amplifier at a first time point according to the system signal; and
   electrically connecting an output end of the operational amplifier and a load at a second time point according to the system signal to output the computation result;
   wherein the Miller compensation signal path is between the output end of the operational amplifier and an input end of an output stage.

2. The coupling isolation method of claim 1, wherein the second time point is later than or at the same time as the first time point to prevent the load signal from coupling into the operational amplifier via the Miller compensation signal path.

3. The coupling isolation method of claim 1, wherein the step of switching off the Miller compensation signal path comprises switching off a switch coupled between the input end and the output end.

4. The coupling isolation method of claim 1, wherein the step of electrically connecting the output end of the operational amplifier and the load comprises switching on a switch coupled between the output end and the load.

5. An operational amplifier capable of preventing a load signal from coupling into the operational amplifier, the operational amplifier comprising:
   a reception end, for receiving a system signal;
   an output end, for outputting a computation result;
   a delay unit, for generating an interruption signal and an output indication signal according to the system signal;
   a differential input stage, for receiving a differential input signal;
   a gain stage, for amplifying the differential input signal;
   an output stage, for generating the computation result according to the amplified differential input signal;
   an output switch, coupled between the output end and a load, for determining whether the output end is electrically connected to the load according to the output indication signal;
   a Miller compensation module, comprising a back end coupled between the output end and the output stage and a front end, for compensating frequency response of the operational amplifier; and
   a switch module, comprising one end coupled to the front end of the Miller compensation module and another end coupled between the gain stage and the output stage, for determining whether the front end of the Miller compensation module is electrically connected to the gain stage and the output stage according to the interruption signal.

6. The operational amplifier of claim 5, wherein the delay unit delays the system signal for a first default period to generate the interruption signal, and delays the system signal for a second default period to generate the output indication signal.

7. The operational amplifier of claim 6, wherein the first default period is greater than the second default period to prevent the load signal from coupling into the operational amplifier via the Miller compensation module.

* * * * *